(12) United States Patent
Turner

(10) Patent No.: US 7,602,634 B2
(45) Date of Patent: *Oct. 13, 2009

(54) DYNAMIC RAM STORAGE TECHNIQUES

(75) Inventor: John Turner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/844,916

(22) Filed: Aug. 24, 2007

(65) Prior Publication Data

US 2007/0285979 A1    Dec. 13, 2007

Related U.S. Application Data

(63) Continuation of application No. 11/451,847, filed on Jun. 12, 2006, now Pat. No. 7,277,316, which is a continuation of application No. 10/798,608, filed on Mar. 10, 2004, now Pat. No. 7,088,606.

(51) Int. Cl.
*G11C 11/24* (2006.01)

(52) U.S. Cl. .................... 365/149; 365/63; 365/187

(58) Field of Classification Search ................ 365/149, 365/154, 156, 63, 187, 203
See application file for complete search history.

(56) References Cited

U.S. PATENT DOCUMENTS

| | | | |
|---|---|---|---|
| 4,418,402 A | 11/1983 | Heagerty et al. | |
| 4,768,172 A | 8/1988 | Sasaki | |
| 4,839,863 A * | 6/1989 | Soneda | 365/154 |
| 5,317,212 A | 5/1994 | Wahlstrom | |
| 5,325,338 A * | 6/1994 | Runaldue et al. | 365/230.05 |
| 5,375,086 A | 12/1994 | Wahlstrom | |
| 5,396,452 A | 3/1995 | Wahlstrom | |
| 5,525,827 A | 6/1996 | Norman | |
| 5,576,560 A * | 11/1996 | Runaldue et al. | 257/208 |
| 5,652,728 A | 7/1997 | Hosotani et al. | |
| 5,656,528 A | 8/1997 | Wahlstrom | |
| 5,796,671 A | 8/1998 | Wahlstrom | |
| 5,859,544 A | 1/1999 | Norman | |
| 5,920,201 A | 7/1999 | Mehrotra et al. | |
| 6,242,772 B1 | 6/2001 | Wahlstrom | |
| 6,307,788 B1 | 10/2001 | Tanaka | |
| 6,335,896 B1 | 1/2002 | Wahlstrom | |
| 6,410,379 B2 | 6/2002 | Wahlstrom | |
| 6,413,830 B1 | 7/2002 | Wahlstrom | |
| 6,581,843 B2 | 6/2003 | Nobukata | |
| 6,700,827 B2 | 3/2004 | Lien et al. | |

(Continued)

*Primary Examiner*—Gene N. Auduong
(74) *Attorney, Agent, or Firm*—Townsend and Townsend and Crew LLP

(57) ABSTRACT

Dynamic RAM (DRAM) cells are provided. Data can be read from a DRAM cell without draining the stored charge stored in the cell. During a read cycle, current flows between a Read Bit line and a supply voltage, and charge is not drained directly from the DRAM storage node. Each DRAM cell has a small number of transistors. The DRAM cell can be used to store configuration data on a programmable integrated circuits (IC). Pass gates are used on programmable ICs to drive signals across the chip. Data stored in DRAM cells is provided directly to the pass gates at the full supply voltage to prevent signal degradation. A p-channel transistor eliminates all N-type junctions from the storage node reducing the collection of particles that may cause soft errors.

28 Claims, 5 Drawing Sheets

U.S. PATENT DOCUMENTS

| | | |
|---|---|---|
| 6,768,668 B2 | 7/2004 | Jain |
| 6,809,979 B1 | 10/2004 | Tang |
| 7,088,606 B2 * | 8/2006 | Turner ........................ 365/149 |
| 7,277,316 B2 * | 10/2007 | Turner ........................ 365/149 |
| 2004/0156228 A1 | 8/2004 | Becker |

* cited by examiner

DYNAMIC RAM STORAGE TECHNIQUES

CROSS-REFERENCES TO RELATED APPLICATIONS

The present application is a continuation application of, and claims priority to, U.S. Non-Provisional application Ser. No. 11/451,847, filed on Jun. 12, 2006, now U.S. Pat. No. 7,277,316, which is a continuation of Non-Provisional application Ser. No. 10/798,608, filed on Mar. 10, 2004, now issued U.S. Pat. No. 7,088,606, each of which is hereby incorporated herein by reference.

BACKGROUND OF THE INVENTION

The present invention relates to DRAM cells, and more particularly, to techniques for storing data in and accessing data from DRAM cells.

Arrays of dynamic random access memory (DRAM) cells have been provided as an alternative to static random access memory (SRAM) storage technology. DRAMs require far less transistors than SRAM devices to store a given quantity of data bytes.

A DRAM cell can be fabricated using standard CMOS technology or other well known types of processing technology. One type of DRAM cell includes a small storage capacitor coupled to a single access transistor. This DRAM cell is a much smaller cell than a typical SRAM cell.

DRAM cells dynamically store data on storage capacitors. Because charge leaks from the capacitors, the cells must be refreshed periodically. A typical DRAM refresh cycle includes the steps of addressing the cells, sensing their contents (i.e. logic high or logic low), and writing the information back in the cells. To refresh DRAM cells, sense circuitry performs a read operation before writing data back. The sense circuitry typically includes sense amplifiers.

When data is read from a single-transistor DRAM cell, charge is drawn directly from the storage capacitor. For example, a stored high voltage will be pulled below the high supply voltage. Because a read operation disturbs the amount of charge stored on the cell capacitor, the operation of the memory array must be synchronized to avoid reading data in the cells during a refresh cycle. This requires more circuitry and tends to limit the operating speed of the circuit.

DRAM technology has been used in many integrated circuit applications. For example, a DRAM cell can be used as the programmable element in a programmable logic device (PLD) instead of an SRAM cell.

PLDs typically require that memory cells store charge at the full value of the supply voltage. The operation of a PLD is adversely effected when charge stored in memory is degraded during read cycles.

It would therefore be desirable to provide DRAM cells that output the full value of the supply voltage. It would also be desirable to provide DRAM cells that do not drain charge away from the storage node during read cycles so that the stored charge can be maintained at the supply voltage.

BRIEF SUMMARY OF THE INVENTION

The present invention provides dynamic RAM (DRAM) cells including DRAM storage and read techniques. Data can be read from a DRAM cell of the present invention without draining the stored charge that represents the data. During a read cycle, current flows between a Read Bit line and a supply voltage, and charge is not drained directly from the DRAM storage node. DRAM cells of the present invention also have a small number of transistors (e.g., 3-5 transistors).

According to some embodiments, DRAM cells of the present invention can be used in memory arrays on a programmable integrated circuit (IC) to store configuration data. On a programmable IC, pass gates couple together different segments of programmable interconnect wires. Pass gates can be used to make multiplexers to bypass various logical functions. Data stored in the DRAM cells can be provided directly to the pass gates at the full value of the supply voltage to prevent signal degradation.

According to other embodiments, DRAM cells of the present invention are less sensitive to soft errors. A p-channel read access transistor is used to access data stored in the DRAM cell. The p-channel transistor eliminates all N-type junctions from the storage node reducing the collection volume of ionizing particles such as alpha particles and cosmic rays that may cause soft errors.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
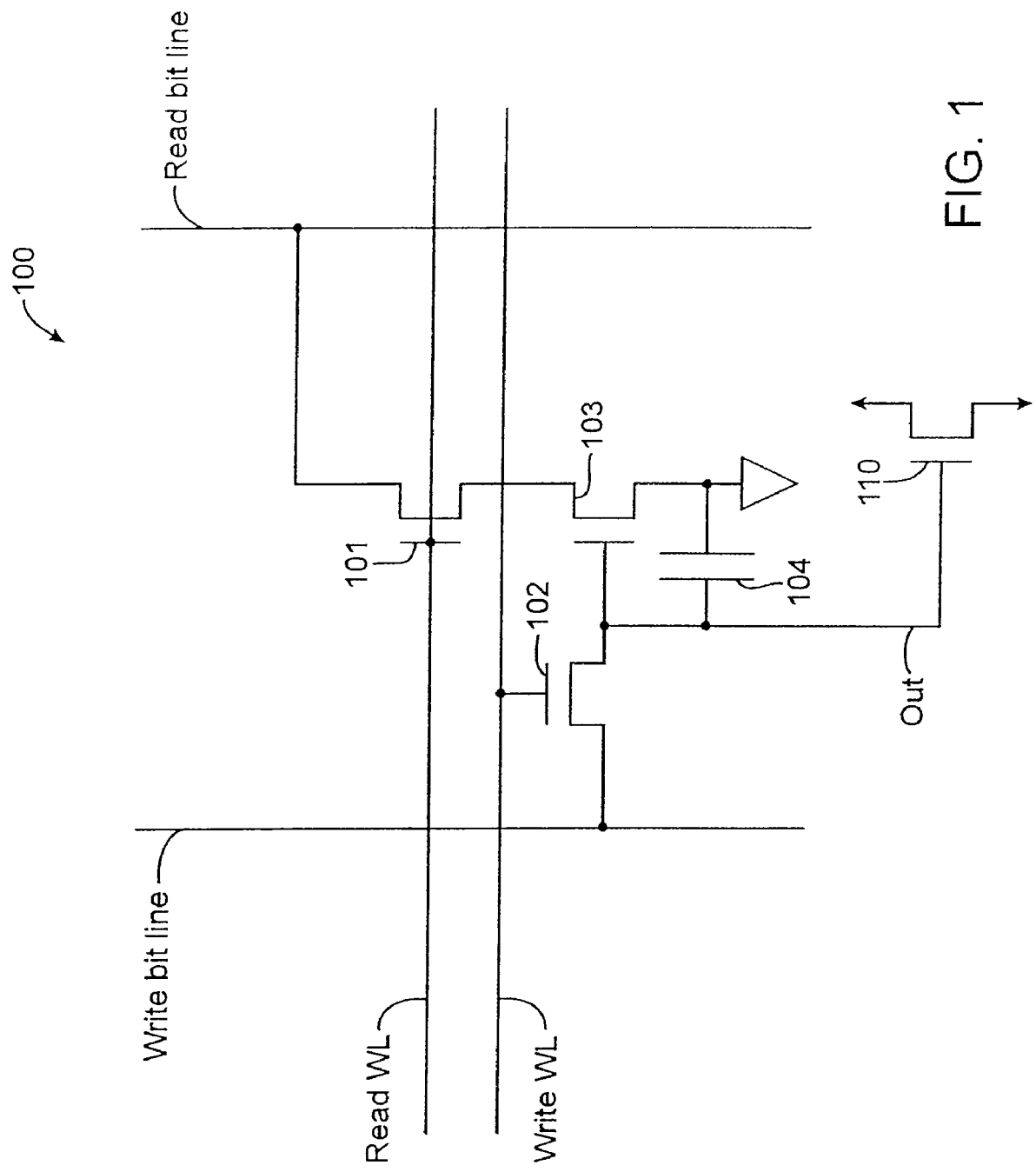
FIG. 1 illustrates a three transistor DRAM cell with a capacitor according to one embodiment of the present invention.

FIG. 1 illustrates a three transistor DRAM cell 100 according to a first embodiment of the present invention. DRAM cell 100 includes n-channel field effect transistors 101, 102, and 103. DRAM cell 100 also includes capacitor 104. The operation of DRAM cell 100 will now be described.

A data bit can be stored in DRAM cell 100 by raising the Write Word Line (WL) to the high supply voltage ($V_{CC}$) to turn on transistor 102. When transistor 102 is on, the gate of transistor 103 is coupled to the Write Bit Line. Data can now be stored on capacitor 104 at the gate of transistor 103 by applying a selected voltage to the Write Bit Line. For example, the Write Bit Line can be driven to a logic high or a logic low to store a logic signal on capacitor 104.

Once a data bit has been stored in DRAM cell 100, the voltage on the Write Word Line is lowered to ground to turn off transistor 102. When transistor 102 is off, the stored voltage on capacitor 104 begins to decay. A periodic refresh of DRAM cell 100 is needed to maintain the voltage on capacitor 104 at or near the supply voltage.

A data bit can be read from DRAM cell 100 by raising the voltage on the Read Word Line (WL) to the high supply voltage to turn transistor 101 on. When transistor 101 is on, current can flow through transistor 101 between the Read Bit Line and transistor 103. If a logic high voltage is stored on capacitor 104, transistor 103 is on.

The bias on the Read Bit Line is set up by sense circuitry. When transistor 101 turns on, current flows from the Read Bit Line through transistors 101 and 103 to the low power supply (ground). The voltage on the Read Bit Line drops. A sense amplifier senses the drop in voltage on the Read Bit Line and adjusts its output signal. The output signal of the sense amplifier is interpreted accordingly.

If a logic low voltage is stored on capacitor 104, transistor 103 is off. When the Read Word Line turns transistor 101 on, current does not flow through transistors 101 and 103 to ground. The sense amplifier does not sense a voltage change on the Read Bit Line, and the sense amplifier's steady output signal is interpreted accordingly.

The data bit stored in DRAM cell 100 can be read repeatedly without draining charge away from capacitor 104 during the read process. Because the charge is stored at the gate of transistor 103, no charge flows from capacitor 104 to the Read Bit Line during a read cycle. In addition, transistor 102 remains off during each read cycle, because two separate Word Lines provide bias to the gates of transistors 101 and 102. As a result, the present invention provides an advantage over many prior art DRAMs that drain charge away from the DRAM cell capacitor in order to read the stored data during each read cycle.

A refresh cycle is typically performed after each read cycle. A refresh can be performed using the Read Bit Line, a sense amplifier, and the Write Bit Line. Data is read from the DRAM cell on the Read Bit Line and amplified by the sense amplifier. The output signal of the sense amplifier is applied back to the DRAM cell via the Write Bit Line.

According to one embodiment, capacitor 104 can be a quasi-static DRAM capacitor fabricated with nano-crystal oxide that is used to form the capacitor dielectric. This type of capacitor stores charge for a longer period of time than standard capacitors allowing DRAM cell 100 to operate at a very low refresh frequency. Capacitor 104 can also be a simple gate oxide capacitor, planar capacitor, or a trench capacitor.

A programmable integrated circuit (IC) is one example of an application of DRAM cell 100. Programmable integrated circuits include programmable logic devices (PLDs), field programmable gate arrays (FPGAs), programmable logic arrays, configurable logic arrays, etc. A programmable integrated circuit can include an array of DRAM cells 100 arranged in rows and columns. Configuration data can be stored in the DRAM cell array. The configuration data is used to program programmable logic blocks and programmable routing resources on the programmable integrated circuit.

Pass gates control programmable interconnects and logic functions in a programmable IC. For example, a pass gate can couple together two different segments of programmable interconnect wires on a programmable IC. As another example, several pass gates can select or deselect circuitry that is used to determine a logic function (e.g., a register or a lookup table).

When DRAM cell 100 is used to store configuration data in a programmable IC, the voltage stored on capacitor 104 directly drives one or more pass gates 110 through the Out terminal shown in FIG. 1. Because the voltage on capacitor 104 drives pass gate 110 directly, the gate voltage of pass gate 110 is driven to the high or low supply voltage (or close to it).

In many programmable ICs, it is important to drive the gates of the pass gates to the full value of the supply voltage (especially at low supply voltages) to minimize the on resistance of the pass gate. A pass gate with a large on-resistance tends to degrade signals transmitted on connecting wires.

When DRAM cell 100 is used in a programmable IC, data bits are read out of the cell through the Out terminal as discussed above, and transmitted to one or more pass gates, as previously discussed. The Read Word and Read Bit Lines can be used to verify data bits stored in the DRAM cells to determine if the cells are operating properly. The Read Word and Read Bit Lines can also be used to refresh the charge on capacitor 104.

Figure 2:
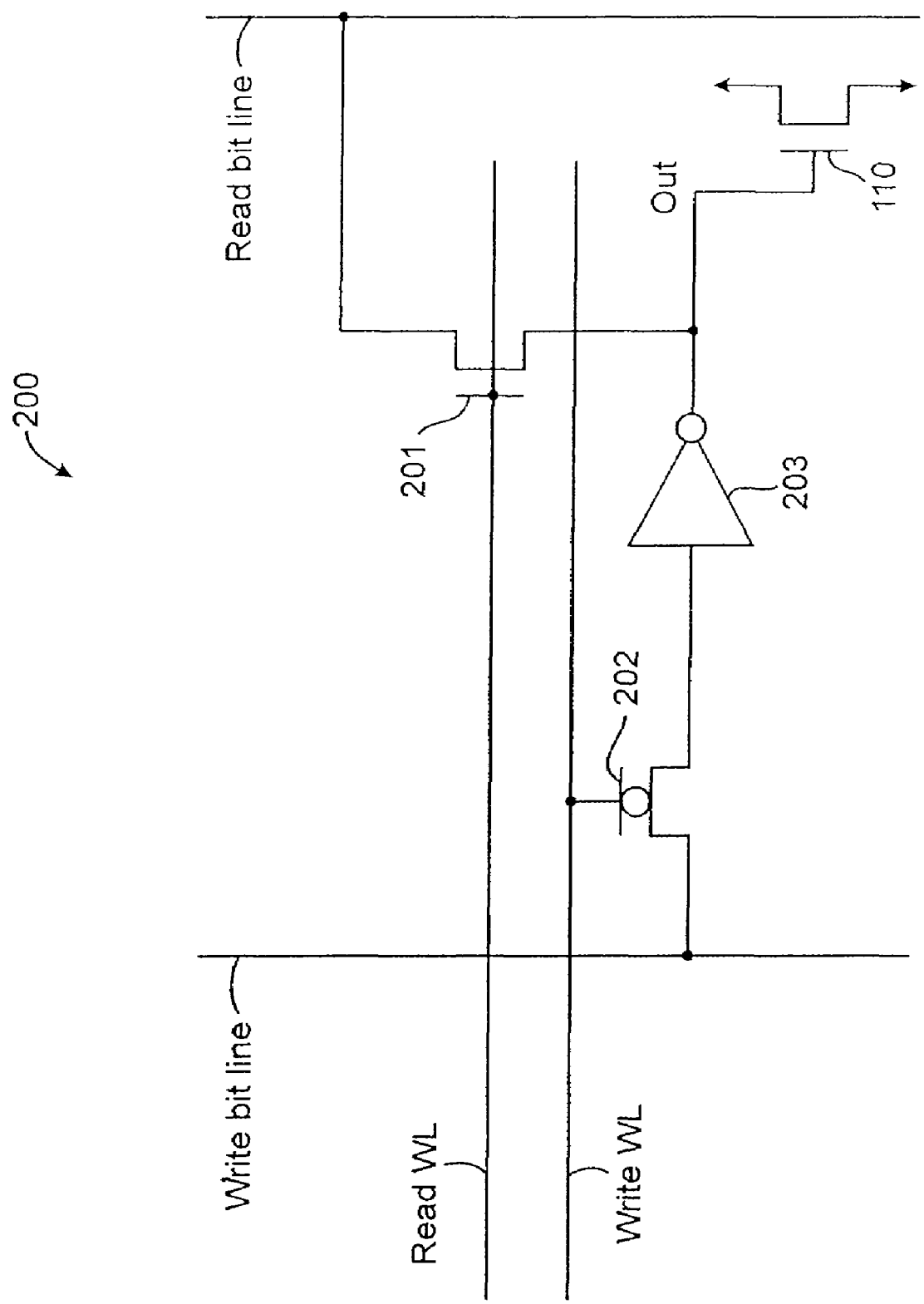
FIG. 2 illustrates a four transistor buffered DRAM cell according to another embodiment of the present invention.

FIG. 2 illustrates another embodiment of a DRAM cell 200 of the present invention. DRAM cell 200 has four transistors including n-channel transistor 201 and p-channel transistor 202. DRAM cell 200 also includes an n-channel transistor and a p-channel transistor in CMOS inverter 203. The operation of DRAM cell 200 will now be discussed.

A data bit can be stored in DRAM cell 200 by lowering the Write Word Line (WL) to the low supply voltage (ground or lower) to turn on p-channel transistor 202. When transistor 202 is on, the input of inverter 203 is coupled to the Write Bit Line. Data can now be stored in inverter 203 by applying a selected voltage to the Write Bit Line.

For example, the Write Bit Line can be raised to a logic high voltage to store a logic low voltage at the output of inverter 203. The Write Bit Line can be raised to a logic low voltage to store a logic high voltage at the output of inverter 203. The voltage on the Write Word Line is raised to the high supply voltage at the completion of the write cycle to turn off transistor 202. CMOS inverter 203 couples the Out terminal to the high or the low supply voltage, depending on the logic state at its input.

DRAM cell 200 can also be used to store configuration data in a programmable IC. In a programmable IC application, the Out terminal is coupled to a pass gate 110, as discussed above. Because inverter 203 drives the voltage at Out to the high or low supply voltages, the pass gate coupled to Out is turned fully on or fully off to prevent signal degradation.

Once transistor 202 is off, the input node of inverter 203 is cut off from a supply voltage, and the charge begins to decay. Therefore, repeated refresh cycles are needed to maintain the voltage stored at the input of inverter 203. The input capacitors of the two transistors in inverter 203 store the charge for the brief periods between refresh cycles. An additional capacitor can be added to the input of inverter 203 such as capacitor 104.

A data bit can be read from DRAM cell 200 by raising the voltage on the Read Word Line (WL) to the high supply voltage to turn transistor 201 on. When the voltage on the Read Word Line is high, current flows through transistor 201 effecting the bias on the Read Bit Line. The bias on the Read Bit Line can be pre-charged to an intermediate voltage to limit the read disturbed charge sharing on node Out.

Sense circuitry coupled to the Read Bit Line senses changes in the bias on the Read Bit Line to determine if a high or low voltage is stored at node Out. If DRAM cell 200 is used in a programmable IC, the Read Bit and Read Word Lines can be used for data verification, operability checks, and refresh cycles.

Data bits can be read from DRAM cell 200 through the Out terminal or through the Read Bit Line without disturbing the charge stored at the input of inverter 203. CMOS inverter 203 isolates the charge stored at its input terminal from the voltage at its output terminal Out.

Another advantage of DRAM cell 200 is that it may not require the additional capacitor 104 in cell 100. However, an additional capacitor can be added to the input of inverter 203. Also, cell 200 requires 4 transistors, two of which are larger area p-channel transistors. An additional benefit of cell 200 is that the voltage at the Out node is driven directly from the high and low power supply voltages.

Figure 3:
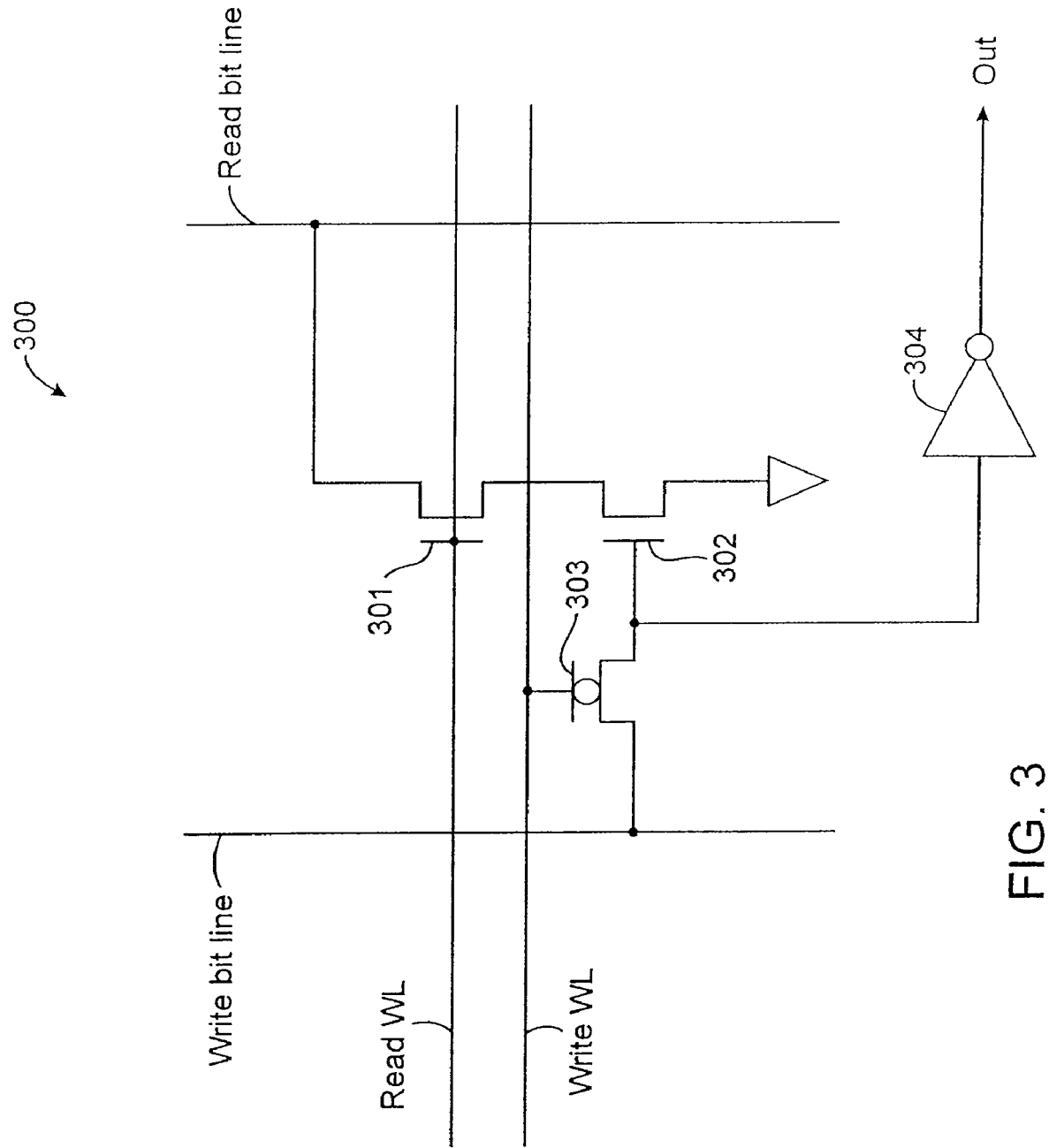
FIG. 3 illustrates a five transistor buffered DRAM cell according to another embodiment of the present invention.

FIG. 3 illustrates another embodiment of a DRAM cell 300 of the present invention. DRAM cell 300 has five transistors including n-channel transistors 301-302 and p-channel transistor 303. DRAM cell 300 also includes an n-channel transistor and a p-channel transistor in CMOS inverter 304. The operation of DRAM cell 300 will now be discussed.

A data bit can be stored in DRAM cell 300 by lowering the Write Word Line (WL) to the low supply voltage (ground or lower) to turn on p-channel transistor 303. When transistor 303 is on, the input of inverter 304 and the gate of transistor 302 are coupled to the Write Bit Line. A data bit can now be stored in inverter 304 by applying a selected voltage to the Write Bit Line.

For example, the Write Bit Line can be raised to a logic high voltage to store a logic low voltage at the output of inverter 304. The Write Bit Line can be driven to a low voltage to store a logic high voltage at the output of inverter 304. Inverter 304 couples the Out terminal to the high or the low supply voltage, depending on the logic state at its input.

The voltage on the Write Word Line is raised high at the end of a write cycle to turn off transistor 303. When transistor 303 is off, the voltage stored at the gate of transistor 302 begins to decay. A periodic refresh of DRAM cell 300 is needed to maintain the voltage at the gate of transistor 302 at or near the supply voltage.

A data bit can be read from DRAM cell 300 by raising the voltage on the Read Word Line (WL) to the high supply voltage to turn transistor 301 on. When transistor 301 is on, current can flow through transistor 301 between the Read Bit Line and transistor 302. If a logic high voltage is stored at the gate of transistor 302, transistor 302 is on. So when the Read Word Line turns transistor 301 on, current can flow between the Read Bit Line and ground through transistors 301 and 302. A sense amplifier senses changes in the voltage on the Read Bit Line and adjusts its output. Changes in the output signal of the sense amplifier are interpreted accordingly.

If a logic low voltage is stored at the gate of transistor 302, transistor 302 is off. So when the Read Word Line turns transistor 301 on, current does not flow through transistors 301 and 302 to ground. The sense amplifier does not sense a voltage change on the Read Bit Line, and the sense amplifier's steady output signal is interpreted accordingly.

As with the previous embodiments, data bits stored in DRAM cell 300 can be read repeatedly without draining charge away from the gate of transistor 302 during the read process. No charge flows from the gate of transistor 302 to the Read Bit Line during a read cycle. Also, no read disturb charge sharing occurs at the Out node during read cycles in DRAM cell 300.

DRAM cell 300 does not require an additional capacitor. However, an additional capacitor can be added to the input of inverter 304 in DRAM cell 300 if desired.

DRAM cells 300 can also be used to store configuration data in a programmable IC. Memory blocks within the programmable IC can include arrays of DRAM cells 100, 200, or 300. A data bit stored in DRAM cell 300 is driven to a pass gate in the programmable IC through inverter 304. Inverter 304 drives the gate of the pass gate to the full value of the supply voltage without read disturb charge sharing at node Out.

DRAM cells 200 and 300 have an improved immunity to soft errors relative to many prior art SRAM memory cells. Soft errors occur, for example, when alpha particles or cosmic rays impact a DRAM cell. The impact causes the charge stored in a DRAM cell to change, e.g., from a logic high to a logic low.

In DRAM cell 200, the write access p-channel transistor 202 eliminates all of the N-type junctions from the storage node at the input of inverter 203. This feature of cell 200 may provide improved soft error immunity. In cell 300, write access p-channel transistor 303 eliminates all of the N-type junctions from the storage node at the input of inverter 304 to provide improved soft error immunity. The p-channel transistor is typically formed in an N-well diffused region that provides some isolation from substrate current caused by alpha particles or cosmic ray strikes.

In cell 100, soft errors can be reduced by selecting an appropriate value for capacitor 104. A trench capacitor, for example, can achieve a large capacitance in a small cell.

DRAM cell 200 provides many of the advantages of DRAM cell 300 with 4 transistors instead of 5 to provide a smaller area memory array. DRAM cell 200 does not have an equivalent of transistor 302 that is coupled to the data storage node. Without such a transistor, cell 200 has a lower capacitance on the storage node relative to cell 300.

Figure 4:
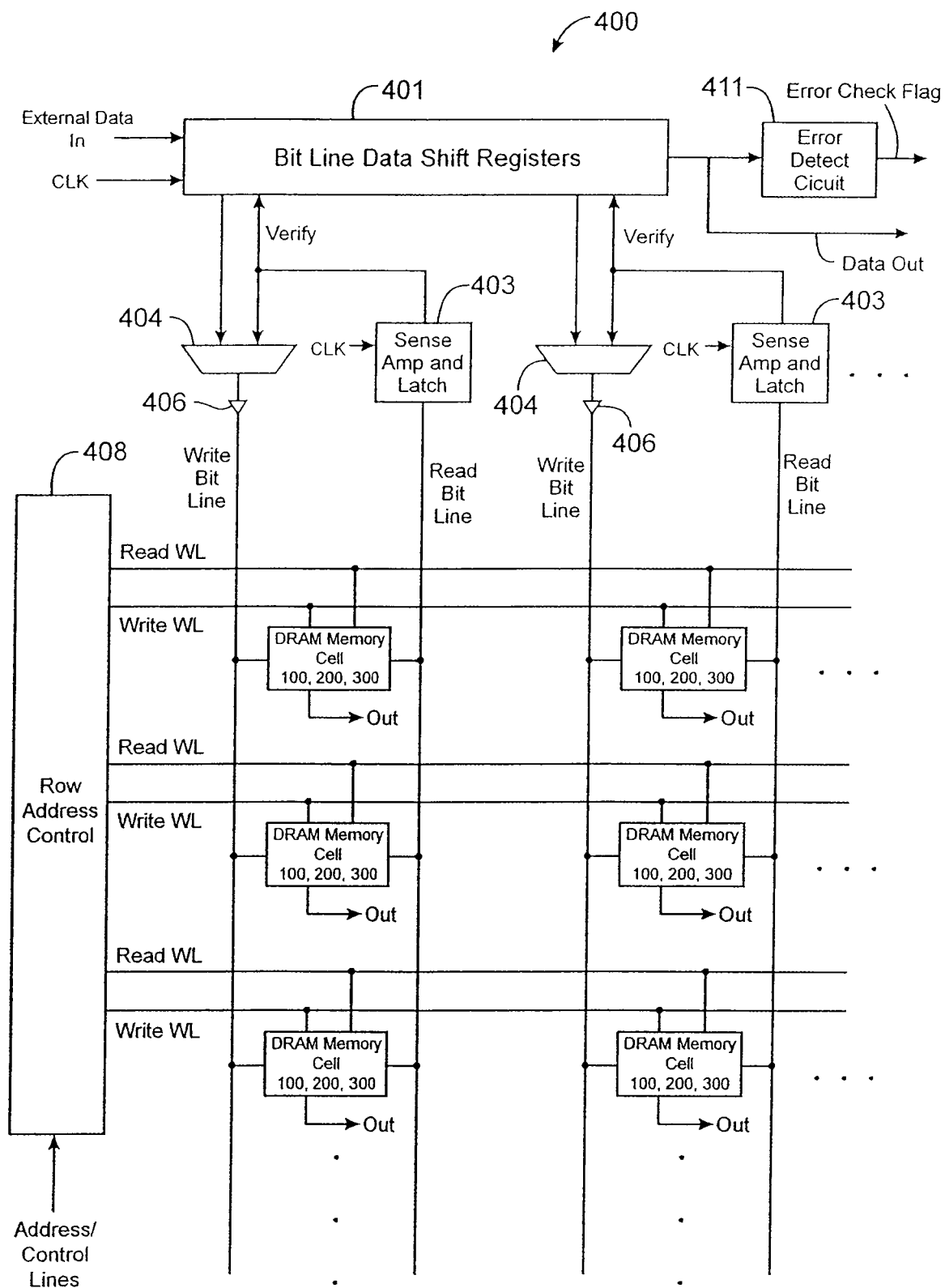
FIG. 4 illustrates a block diagram of an array of DRAM memory cells and associated refresh circuitry according to an embodiment of the present invention.

FIG. 4 illustrates an array 400 of DRAM cells and associated circuitry according to an embodiment of the present invention. Array 400 include several rows and columns of DRAM cells. The DRAM cells of array 400 can be cell designed as shown in FIG. 1, FIG. 2, or FIG. 3.

DRAM array 400 includes bit line data shift registers 401 and row address control block 408. Data is usually shifted into registers 401 from an external source. Registers 401 are controlled by a clock signal CLK. Registers 401 are coupled to first inputs of multiplexers 404. Multiplexers 404 are controlled by a select signal (not shown). Drivers 406 drive signals from the outputs of multiplexers 404 to the Write Bit Lines.

Sense amplifiers 403 amplify the signals on the Read Bit Lines. The output signals of sense amplifiers 403 are stored in latches. The latches maintain the output signals of amplifiers 403 after the Read Bit Lines are decoupled from the stored signals in the DRAM cells. The latches are controlled by clock signal CLK.

Row address control block 408 receives address and control signals. Block 408 decodes the address signals. The address signals are used to select rows of DRAM memory cells using the Read and Write Word Lines. The control signals control the operation of block 408.

During a write cycle, row address control block 408 selects a row of memory cells by applying voltages to the Write Word Lines. The select signal causes multiplexers 404 to couple registers 401 to drivers 406. Data bits are transferred from registers 401 to the Write Bit Lines and stored in corresponding DRAM memory cells. The Out terminals of the DRAM memory cells drive pass gates directly as discussed above.

During a refresh cycle, row address control block 408 drives one of the Read Word Lines to place a selected row of DRAM cells in read mode. The stored data bits in a selected row of memory cells are transferred to sense amplifiers 403 via the Read Bit Lines. Sense amplifiers 403 amplify the signals on the Read Bit Lines. The output signals of amplifiers 403 are stored in latches. The outputs of the latches are coupled to the second inputs of multiplexers 404.

Row address control block 408 then drives a Write Word Line to place the selected row of DRAM cells in write mode. The select signal causes multiplexers 404 to drive the output signals of sense amplifiers 403 onto the Write Bit Lines via drivers 406. The storage nodes of the memory cells are refreshed by the signals driven to the Write Bit Lines. Row address control block 408 then selects the next row of memory cells to refresh their stored charge. The process continues until all of the charge signals stored in the memory cells have been refreshed.

According to another embodiment, a refresh cycle can be performed using data that is received from an external source. The refresh data is provided from an external source to registers 401 through the external data input. Multiplexers 404 drive the external data signals to the Write Bit Lines via drivers 406. Charge stored in the DRAM memory cells is refreshed by the signals driven onto the Write Bit Lines.

According to still another embodiment, array 400 can verify the integrity of the data signals stored in the DRAM memory cells. Array 400 includes an error detection circuit 411 that detects errors and performs data verification. For example, error detection circuit 411 can perform a cyclic redundancy check (CRC) function. CRC is a data error detection process that is well-known to those of skill in the art. Circuit 411 can also correct data errors using well known error correction techniques.

As data is refreshed in each row of memory cells, the output signals of sense amplifiers 403 are driven to registers 401 as shown in FIG. 4 along the verify wire connections. The output signals of amplifiers 403 are then shifted to error detection circuit 411, which identifies any data bit errors. The data verification and error detection process can be performed concurrently with either one of the refresh processes discussed above.

Figure 5:
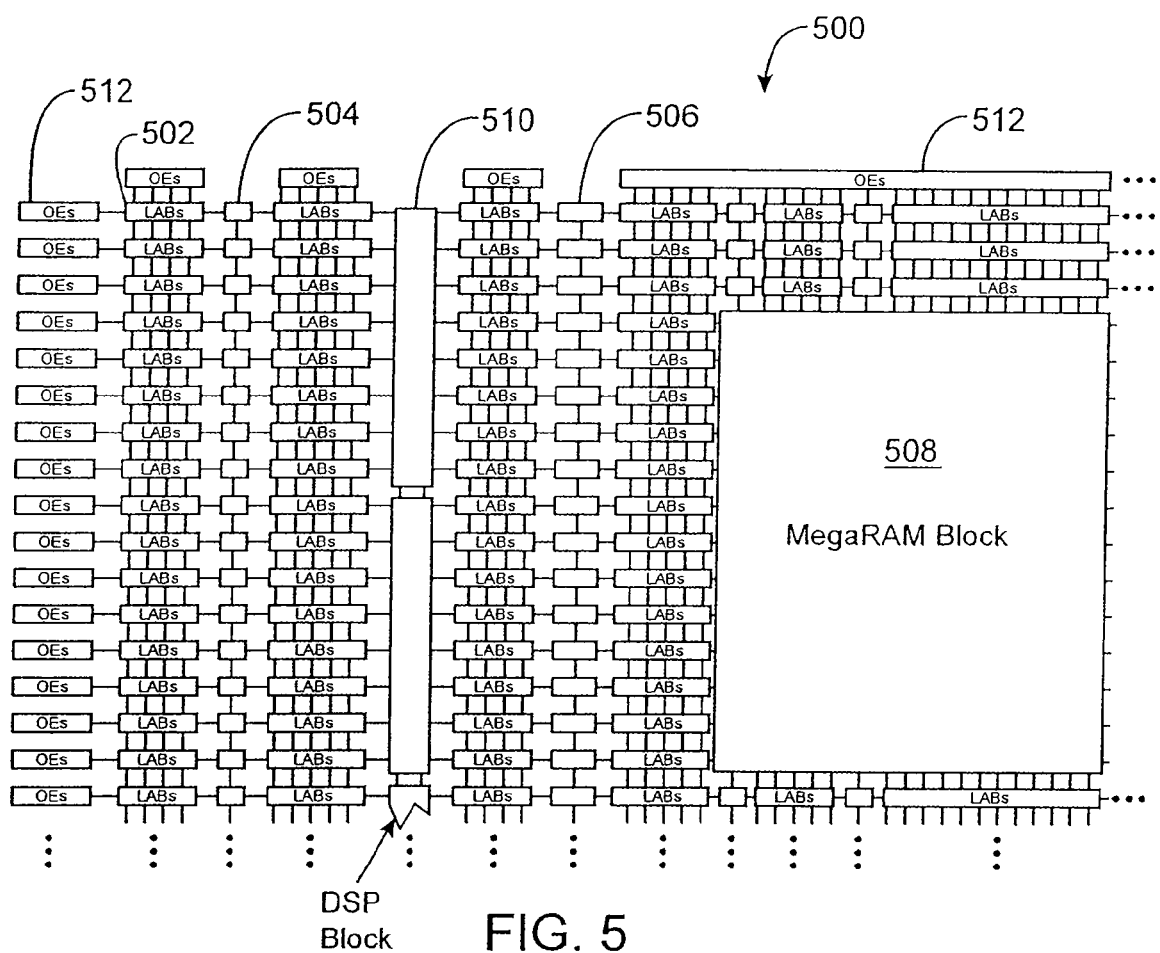
FIG. 5 is a simplified block diagram of a programmable logic device that can implement embodiments of the present invention.

FIG. 5 illustrates an example of one type of programmable IC architecture that can be used with the techniques of the present invention. PLD 600 includes a two-dimensional array of programmable logic array blocks (or LABs) 602 that are interconnected by a network of column and row interconnects of varying length and speed. LABs 602 include multiple (e.g., 10) logic elements (or LEs).

PLD 600 also includes a distributed memory structure including RAM blocks of varying sizes provided throughout the array. The RAM blocks include, for example, 512 bit blocks 604, 4K blocks 606, and a MegaBlock 608 providing 512K bits of RAM. Any of memory blocks 604, 606, and 608 can include DRAM memory cells of the present invention such as the ones shown in FIGS. 1-3.

These memory blocks can also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 6:
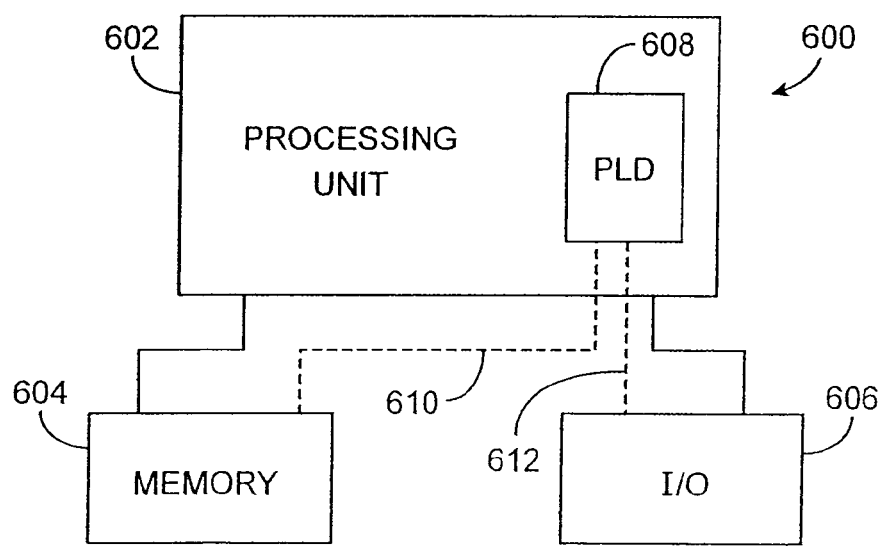
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 6. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A memory cell, the memory cell comprising:
   an n-channel transistor having a gate coupled to a read word line and a drain coupled to a read bit line;
   an inverter having an output coupled to a source of the n-channel transistor;
   a p-channel transistor coupled between an input of the inverter and a write bit line, a gate of the p-channel transistor being coupled to a write word line; and
   a pass gate having a gate directly connected to the source of the n-channel transistor and coupled to the output of the inverter such that a voltage stored on the inverter is operable to drive a gate voltage of the pass gate, wherein the voltage stored on the inverter comprises a data bit of the memory cell.

2. The memory cell according to claim 1, wherein the pass gate is a programmable routing connector that couples interconnect lines on a field programmable gate array.

3. The memory cell according to claim 1, wherein the pass gate is used to configure logic performed by logic circuitry on a field programmable gate array.

4. The memory cell according to claim 1, wherein the pass gate is turned fully on or fully off in order to prevent signal degradation.

5. The memory cell according to claim 1, wherein at least one refresh cycle is used to maintain a voltage stored at an input of the inverter.

6. The memory cell according to claim 1, wherein the inverter is a CMOS inverter.

7. The memory cell according to claim 6, wherein the inverter further includes a second p-channel transistor and a second n-channel transistor.

8. The memory cell according to claim 7, wherein the second p-channel and second n-channel transistor in the inverter store charge between refresh cycles.

9. The memory cell according to claim 1, wherein the input of the inverter is not directly connected to an N-type doped semiconductor region.

10. The memory cell according to claim 1 wherein the voltage stored on the inverter is operable to drive a gate voltage of the pass gate to the full value of a supply voltage.

11. The memory cell according to claim 1 wherein the memory cell comprises a DRAM cell.

12. The memory cell according to claim 1 wherein the output of the inverter is directly connected to the source of the n-channel transistor.

13. A method of operating a memory cell, the method comprising:
applying a first voltage on a write word line to turn on a p-channel transistor within the memory cell, wherein the p-channel transistor is coupled between an input of an inverter and a write bit line;
applying a second voltage on the write bit line coupled to a drain of the p-channel transistor to store a charge at the inverter;
applying a third voltage on the write word line to turn off the p-channel transistor;
applying a fourth voltage on a read word line to turn on a first n-channel transistor, the first n-channel transistor coupled in series with a second n-channel transistor; and
driving a gate voltage of a pass gate using the charge stored on the inverter.

14. The method according to claim 13, further comprising:
sensing a fifth voltage on a read bit line coupled to a drain of the first n-channel transistor.

15. The method according to claim 13, further comprising:
turning the pass gate fully on or fully off in order to prevent signal degradation.

16. The method according to claim 13, further comprising:
using at least one refresh cycle to maintain a voltage stored at an input of the inverter.

17. The method according to claim 13, wherein the driving the gate voltage of a pass gate comprises driving the pass gate to the full value of a supply voltage.

18. A memory cell, the memory cell comprising:
an n-channel transistor having a gate coupled to a read word line and a drain coupled to a read bit line;
a single inverter having an output directly connected to a source of the n-channel transistor, such that a voltage stored on the inverter is operable as a data bit of the memory cell; and
a p-channel transistor coupled between an input of the single inverter and a write bit line, a gate of the p-channel transistor being coupled to a write word line.

19. The memory cell according to claim 18, wherein the output of the inverter is coupled to a pass gate.

20. The memory cell according to claim 19, wherein the pass gate is a programmable routing connector that couples interconnect lines on a field programmable gate array.

21. The memory cell according to claim 19, wherein the pass gate is used to configure logic performed by logic circuitry on a field programmable gate array.

22. The memory cell according to claim 18, wherein the input of the inverter is not directly connected to an N-type doped semiconductor region.

23. The memory cell according to claim 18, further comprising a capacitor coupled to the input of the inverter.

24. The memory cell according to claim 23, wherein the capacitor is one of a planar capacitor and a trench capacitor.

25. The memory cell according to claim 18, further comprising:
a sense amplifier having an input coupled to the read bit line; and
a multiplexer coupled between an output of the sense amplifier and the write bit line.

26. The memory cell according to claim 18, wherein the single inverter further includes a second p-channel transistor and a second n-channel transistor.

27. The memory cell according to claim 18, wherein the single inverter isolates the charge stored at the input terminal of the single inverter from an output terminal of the single inverter.

28. The memory cell according to claim 18 wherein the memory cell comprises a DRAM cell.

* * * * *